United States Patent
Nemeth et al.

(10) Patent No.: US 10,149,391 B2
(45) Date of Patent: Dec. 4, 2018

(54) TRENCH CUTTING WITH LASER MACHINING

(71) Applicant: uBeam Inc., Santa Monica, CA (US)

(72) Inventors: Nicholas Lavada Nemeth, Santa Monica, CA (US); Adam Stephen Elhadad, Santa Monica, CA (US); Andrew Joyce, Venice, CA (US); Sean Taffler, Pacific Palisades, CA (US)

(73) Assignee: uBeam Inc., Marina del Rey, CA (US)

( * ) Notice: Subject to any disclaimer, the term of this patent is extended or adjusted under 35 U.S.C. 154(b) by 451 days.

(21) Appl. No.: 15/064,440

(22) Filed: Mar. 8, 2016

(65) Prior Publication Data

US 2017/0265308 A1    Sep. 14, 2017

(51) Int. Cl.
| | |
|---|---|
| *H05K 3/00* | (2006.01) |
| *H05K 3/40* | (2006.01) |
| *B23K 26/06* | (2014.01) |
| *B23K 26/38* | (2014.01) |
| *B23K 26/402* | (2014.01) |
| *B23K 26/364* | (2014.01) |
| *B23K 103/16* | (2006.01) |

(52) U.S. Cl.
CPC ......... *H05K 3/0026* (2013.01); *B23K 26/364* (2015.10); *B23K 26/38* (2013.01); *B23K 26/402* (2013.01); *B23K 2203/172* (2015.10); *H05K 3/0052* (2013.01); *H05K 2201/09845* (2013.01); *H05K 2203/0346* (2013.01); *H05K 2203/107* (2013.01)

(58) Field of Classification Search
CPC . H05K 3/00; H05K 3/40; B23K 26/38; B23K 26/40; B23K 26/06; B23K 26/36
USPC ........................................ 219/121.67–121.72
See application file for complete search history.

(56) References Cited

U.S. PATENT DOCUMENTS

| | | | | |
|---|---|---|---|---|
| 5,580,466 | A  * | 12/1996 | Tada | B23K 26/067 216/14 |
| 7,572,350 | B2 * | 8/2009 | Furui | B32B 43/003 156/250 |
| 2009/0272562 | A1* | 11/2009 | Yoshioka | H05K 1/162 174/250 |

* cited by examiner

*Primary Examiner* — Samuel M Heinrich
(74) *Attorney, Agent, or Firm* — Morris & Kamlay LLP

(57) ABSTRACT

Systems and techniques are provided for trench cutting with laser machining. A laminate material including a conductive layer and a non-conductive layer may be cut with a first cut using a UV-laser. The cutting of a second cut, using the UV-laser, may be started at a top electrode of the non-conductive layer based on the location of the first cut, wherein the second cut is wider than the first cut. The cutting of the second cut may be stopped partially though the non-conductive layer. The stopping of the cutting of the second cut partially though the non-conductive layer may include stopping the cutting of the second cut before cutting a bottom electrode of the non-conductive layer.

20 Claims, 7 Drawing Sheets

TRENCH CUTTING WITH LASER MACHINING

BACKGROUND

Laminate materials may include combinations of conductive and non-conductive layers. Cutting through laminate materials, for example, using a UV-laser, may result in conductive material from a conductive layer contaminating the non-conductive layer through melting or sublimation of the conductive material. When the non-conductive layer includes electrodes on either side, the contaminating conductive material may cause electrical shorts, as it may coat a sidewall of the non-conductive layer between the electrodes, electrically connecting the electrodes. This may affect the performance and functionality of the laminate material.

BRIEF SUMMARY

According to an implementation of the disclosed subject matter, a laminate material including a conductive layer and a non-conductive layer may be cut with a first cut using a UV-laser. The cutting of a second cut, using the UV-laser, may be started at a top electrode of the non-conductive layer based on the location of the first cut, wherein the second cut is wider than the first cut. The cutting of the second cut may be stopped partially though the non-conductive layer. The stopping of the cutting of the second cut partially though the non-conductive layer may include stopping the cutting of the second cut before cutting a bottom electrode of the non-conductive layer.

A laminate material including a conductive layer and a non-conductive layer may be cut with a first cut using a UV laser. The top electrode the non-conductive layer may be ablated using a UV-laser based on the location of the first cut, wherein the ablation removes portions of the top electrode starting at the edges of the first cut.

A non-conductive material may cut with a first cut using a UV-laser. The cutting of a second cut using a UV-laser may be started at a top electrode of the non-conductive material based on the location of the first cut, wherein the second cut is wider than the first cut. The cutting of the second cut may be stopped partially though the non-conductive material.

Systems and techniques disclosed herein may allow for trench cutting with laser machining. Additional features, advantages, and embodiments of the disclosed subject matter may be set forth or apparent from consideration of the following detailed description, drawings, and claims. Moreover, it is to be understood that both the foregoing summary and the following detailed description are examples and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate embodiments of the disclosed subject matter and together with the detailed description serve to explain the principles of embodiments of the disclosed subject matter. No attempt is made to show structural details in more detail than may be necessary for a fundamental understanding of the disclosed subject matter and various ways in which it may be practiced.

DETAILED DESCRIPTION

Figure 1:
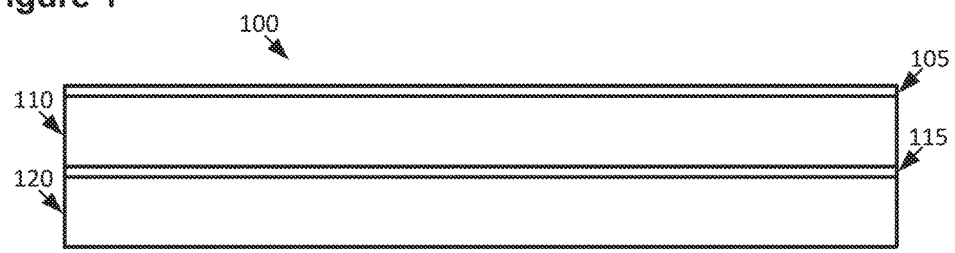
FIG. 1 shows an example laminate material according to an implementation of the disclosed subject matter.

According to embodiments disclosed herein, trench cutting with laser machining may allow for the removal of possible electrical shorts due to unwanted deposition of conductive material during cutting of a laminate material.

A laminate material may include conductive and non-conductive layers. The laminate material may be cut through using a UV-laser, separating the laminate material into separate pieces or creating divisions or cut outs within a continuous material. A second cut into the laminate material may be made using the UV-laser. The second cut may be wider than the first cut, and may be aligned with the first cut, creating a trench in the laminate material. The second cut may start at a top electrode of a non-conductive layer of the laminate material, and may be stopped after cutting partially through the non-conductive layer. The second cut may remove any unwanted electrical connections created through deposition of conductive material onto the non-conductive layer, preventing shorts between the top and bottom electrodes of the non-conductive layer.

A laminate material may include conductive and non-conductive layers separated by electrodes and held together using any suitable combination of conductive and non-conductive bonding materials. For example, a laminate material may include a first layer made of a non-conductive material, such as, for example, piezoelectric ceramic or other piezoelectric or dielectric material, with an electrode on the top and bottom of the first layer, and a second layer made of a conductive material, such as, for example, metals, including aluminum, stainless steel, and brass. The first and second layers of the laminate material may be bonded together, for example, using any suitable epoxies. The second layer may be bonded to the bottom electrode of the first layer, electrically connecting the conductive material of the second layer with the bottom electrode of the first layer. The top electrode may be exposed. The electrode on the top and bottom of the first, non-conductive layer, may be electrically separated by the non-conductive material.

The laminate material may be cut into pieces. For example, the laminate material may be cut into flexures which may be used in ultrasonic transducers. A UV-laser may be used to cut the laminate material. A first cut may be made through the laminate material. For example, the UV-laser may be used to cut from the top electrode of the first layer through the bottom of the second layer, separating the laminate material into two pieces. The first cut may also be made from the bottom of the second layer up through the top electrode of the first layer. The first cut may be narrow, for example, the narrowest cut possible given the UV-laser used. After the first cut, conductive material from the second layer may contaminate the non-conductive material of the first layer. For example, conductive material may melt or sublimate onto the sidewalls of the first layer of each piece of the laminate material on either side of the location of the first cut. The conductive material may electrically connect the top and bottom electrodes of the first layer on either piece of the laminate material, creating electrical shorts in the pieces of laminate material. The contaminating conductive material may be conductive sediment. In some implementations, the first cut may be used to cut out a portion of the laminate material without separating the laminate material into physically distinct and separable pieces. For example, the first cut may cut a pattern into a continuous piece of laminate material by cutting through the laminate material while leaving the laminate material connected to itself around the first cut.

A second cut may be made using the UV-laser. The second cut may be made at the same location on the laminate material as the first cut. The separate pieces of the laminate material may be kept in place after the first cut, maintaining the separation between the pieces resulting from the first cut. When the first cut does not separate the laminate material into pieces, the laminate material may be left in place or realigned using fiducial marks. The second cut may be wider than the first cut. For example, the second cut may have a width of one to five beam widths of the UV-laser, or any other suitable width that is wider than the width of the first cut, such as for example, 20 beam widths of the UV-laser. The second cut may be made from the top electrode of the first layer partially though the first layer, stopping before reaching the bottom electrode of the first layer on either piece of the laminate material. The second cut may be made to any suitable depth through the first layer. The depth of the second cut may be determined by, for example, the breakdown voltage of the ambient environment in which the laminate material will be used and the breakdown voltage of the non-conductive material used in the first layer. The second cut may remove conductive material, or conductive sediment, that has been deposited on the sidewall of the separate pieces of the first layer, removing any electrical connection that the conductive material may have created between the top and bottom electrodes of the first layer of either piece of the laminate material during the making of the first cut.

The laminate material may include an additional non-conductive layer. A third layer, including a top and bottom electrode, may be bonded to the second layer on the other side of the second layer from the first layer. This may result in a laminate material which includes a first layer and third layer of non-conductive material on either side of a second layer of conductive material. The top electrode of the third layer may be exposed, with the bottom electrode of the third layer being bonded to the second layer. The laminate material may be cut into two separate pieces, or may have portions of the laminate material cut out, using a UV-laser. The first cut may be made through the laminate material, for example, from the top electrode of the first layer through the top electrode of the third layer, or vice versa, separating the laminate material into two pieces. The first cut may be narrow, for example, the narrowest cut possible given the UV-laser used. After the first cut, conductive material from the second layer may contaminate the non-conductive material of the first layer and the third layer. For example, conductive material may melt or sublimate onto the sidewall of the first layer and third layer of each piece of the laminate material on either side of the location of the first cut. The conductive material may electrically connect the top and bottom electrodes of the first layer or third layer on either piece of the laminate material, creating electrical shorts in the pieces of laminate material. The contaminating conductive material may be conductive sediment. In some implementations, the first cut may be used to cut out a portion of the laminate material without separating the laminate material into physically distinct and separable pieces. For example, the first cut may cut a pattern into a continuous piece of laminate material by cutting through the laminate material while leaving the laminate material connected to itself around the first cut.

A second cut may be made using the UV-laser. The second cut may be made at the same location on the laminate material as the first cut. The separate pieces of the laminate material may be kept in place after the first cut, maintaining the separation between the pieces resulting from the first cut. When the first cut does not separate the laminate material into pieces, the laminate material may be held in place or realigned using fiducial marks. The second cut may be wider than the first cut. For example, the second cut may have a width of one to five beam widths of the UV-laser, or any other suitable width that is wider than the width of the first cut, such as for example, 20 beam widths of the UV-laser. The second cut may be made from the top electrode of the first layer partially though the first layer, stopping before reaching the bottom electrode of the first layer on either piece of the laminate material. The second cut may be made to any suitable depth through the first layer. The depth of the second cut may be determined by, for example, the breakdown voltage of the ambient environment in which the laminate material will be used and the breakdown voltage of the non-conductive material used in the first layer. The second cut may remove conductive material, or conductive sediment, that has been deposited on the sidewall of the separate pieces of the first layer, removing any electrical connection that the conductive material may have created between the top and bottom electrodes of the first layer on either piece of the laminate material during the making of the first cut.

After, or concurrent with the second cut, a third cut may be made using the UV-laser. The third cut may be made at the same location on the laminate material as the first cut. The separate pieces of the laminate material may be kept in place after the first cut and second cut, maintaining the separation between the pieces resulting from the first cut and second cut. When the first cut does not separate the laminate material into pieces, the laminate material may be held in place or realigned using fiducial marks. The third cut may be wider than the first cut, and may be the same width as the second cut. For example, the third cut may have a width of one to five beam widths of the UV-laser, or any other suitable width that is wider than the width of the first cut, such as for example, 20 beam widths of the UV-laser. The third cut may be made from the top electrode of the third layer partially though the third layer, stopping before reaching the bottom electrode of the third layer on either piece of the laminate material. The third cut may be made to any suitable depth through the third layer, including, for example, the same depth as the second cut. The depth of the third cut may be determined by, for example, the breakdown voltage of the ambient environment in which the laminate material will be used and the breakdown voltage of the non-conductive material used in the third layer. The third cut may remove conductive material, or conductive sediment, that has been deposited on the sidewall of the separate pieces of the third layer, removing any electrical connection that the conductive material may have created between the top and bottom electrodes of the third layer on either piece of the laminate material during the making of the first cut.

The second cut and third cut may be made sequentially. For example, after the second cut the UV-laser, the laminate material, or both, may be repositioned so that the UV-laser may make the third cut. The second and third cut may also be made concurrently. For example, two UV-lasers may be operated simultaneously on either side of the laminate material, which may be held in place with any suitable rigging.

Instead of a second cut, the UV-laser may be used to ablate the laminate material. For example, after the first cut through the laminate material, light, tightly packed passes over the laminate material with the UV-laser may be used to ablate the top electrode of the first layer of each piece of the laminate material on either side of the first cut. Ablation may be used to remove any suitable amount of the top electrode. For example, a length of 100 micrometers of the electrode, starting at the edge of the electrode formed by the first cut, may be removed through UV-laser ablation. Ablation may be used on each piece of the laminate material after the first cut, and may be performed with separate passes of the UV-laser for each piece, or may be performed on both pieces in the same pass. This may electrically separate any connection that may have been formed between the top and bottom electrodes by deposition of conductive material, as conductive sediment, on the sidewalls of each piece of the first layer during the making of the first cut.

Non-conductive material with electrodes, such as the first layer of the laminate material, may be processed with a UV-laser on its own, without being part of laminate material. For example, a piezoceramic may include a top and bottom electrode. A UV-laser may be used to make a first cut into the piezoceramic, cutting it into two separate piezoceramic pieces. During the making of the first cut, material from the top or bottom electrode may enter into the cut and be deposited on the sidewalls of either or both of the piezoceramic pieces. The electrode material may form an electrical connection between the top and bottom electrodes of either of the piezoceramic pieces, creating an electrical short. The UV-laser may be used to make a second cut through the top electrode and partially through the piezoceramic of both piezoceramic pieces. The second cut may be wider than the first cut, and may electrically separate the top electrodes of the pieces of piezoceramic from any electrode material that remains on the sidewalls of the pieces of piezoceramic. The second cut may be made to any suitable depth. The UV-laser may also be used to make a third cut through the bottom electrode and partially through the piezoceramic of both piezoceramic pieces. The third cut may be wider than the first cut, and may be, for example, the same width as the second cut. The third cut may also be the same depth as the second cut. The third cut may electrically separate the bottom electrodes of the pieces of piezoceramic from any electrode material that remains on the sidewalls of the pieces of piezoceramic. Ablation of the electrodes with the UV-laser may also be performed in place of the second and third cuts. Ablation may remove some length of the top and bottom electrodes of the piezoceramic pieces, such as, for example, 100 micrometers of the electrode starting at the edge created by the first cut.

The UV-laser used to make cuts into or ablate the laminate material or non-conductive material may be any suitable UV-laser with any suitable beam width. The UV-laser may be part of a computer-controlled laser cutting device, which may include any suitable computing hardware and software, electronics, and electrical and mechanical devices for controlling the operation and motion of any suitable number of UV-lasers. Any suitable rigs or devices may be used to hold the laminate material or non-conductive material being cut or ablated and may be able to reposition the laminate material or non-conductive material, for example, based on computer-control of the holding rig or device. Cutting or ablating of the laminate material or non-conductive material with the UV-laser may be fully automated, for example, as a laser machining step in an assembly-line process.

In some implementations, cutting devices other than a UV-laser may be used to make cuts into the laminate material or non-conductive material. For example, the cuts may be made using infrared lasers, $CO_2$ lasers, CNC mills, wire saws, water jets, or any other suitable cutting or sawing device.

The first cut, second cut, and third cut, may be made in any suitable shape. For example, the first cut may be a straight cut which may or may not separate the laminate material into two separate physical pieces. The first cut may be a curved cut, such as, for example, a U-shaped cut, which may result in a U-shaped cutout in the laminate material, but may not separate the laminate material into separate physical pieces. The first cut may also be any other suitable shape, including any combination of straight and curved segments. The second cut and the third cut may follow the shape of the first cut.

FIG. 1 shows an example laminate material according to an implementation of the disclosed subject matter. A laminate material 100 may include a first layer 110 and a second layer 120. The first layer 110 may be any suitable non-conductive material, including, for example, a piezoelectric material such as a piezoceramic or a dielectric material. The first layer 110 may include a top electrode 105 and a bottom electrode 115. The top electrode 105 and the bottom electrode 115 may be made of any suitable material, and may be attached or added to the non-conductive material of the first layer 110 in any suitable manner. The second layer 120 may be any suitable conductive material, including, for example, metals such as aluminum, stainless steel, and brass. The first layer 110 may electrically separate the top electrode 105 from the bottom electrode 115. The second layer 120 may be bonded to the first layer 110 at the bottom electrode 115 to form the laminate material 100. The bond may be made in any suitable manner, including, for example, through the use of conductive and non-conductive epoxies.

Figure 2:
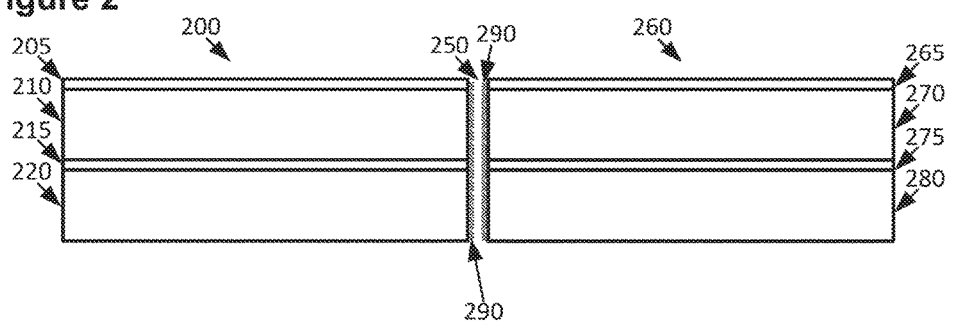
FIG. 2 shows an example laminate material according to an implementation of the disclosed subject matter.

FIG. 2 shows an example laminate material according to an implementation of the disclosed subject matter. A first cut 250 may be made through the laminate material 100. The first cut 250 may be made by, for example, a UV-laser, and may separate the laminate material 100 into a first piece 200 and second piece 260. The first piece 200 may include a first layer 210 and a second layer 220. The first layer 210 may be a piece of the first layer 110 from the laminate material 100 and may include top electrode 205 and bottom electrode 215, which may be pieces of the top electrode 105 and the bottom electrode 115 from the laminate material 100. The second layer 220 may be a piece of the second layer 120 from the laminate material 100. The second piece 260 may include a first layer 270 and a second layer 280. The first layer 270 may be a piece of the first layer 110 from the laminate material 100 and may include top electrode 265 and bottom electrode 275, which may be pieces of the top electrode 105 and the bottom electrode 115 from the laminate material 100. The second layer 280 may be a piece of the second layer 120 from the laminate material 100.

The first cut 250 may be any suitable width, and may be, for example, less than one beam width of the UV-laser used to make the cut. The first cut 250 may be straight, for example, creating edges with 90 degree corners, or may be made at any suitable angle through the laminate material 100. The first cut 250 may be made starting at the top electrode 105 and going through the second layer 120, or may start at the bottom of the second layer 120 and go through the top electrode 105. During the making of the first cut 250, conductive material from the second layer 120 may be deposited as conductive sediment 290 onto the sidewalls of the first layer 210 and the first layer 270 on either side of the first cut 250. For example, conductive material from the first layer 120 may melt or sublimate during the making of the first cut 250. The conductive sediment 290 may form an electrical connection either of both of between the top electrode 205 and bottom electrode 215 across the non-conductive first layer 210 and between the top electrode 265 and the bottom electrode 275 across the non-conductive first layer 270. These may be electrical shorts which may impact the performance of the pieces 200 and 260 of the laminate material 100.

Figure 3:
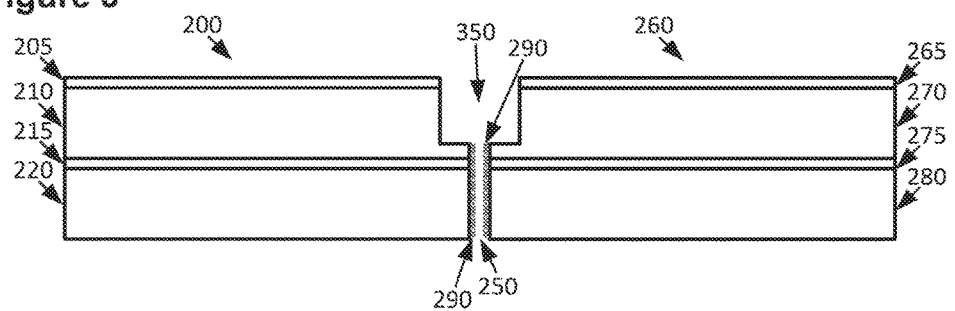
FIG. 3 shows an example laminate material e according to an implementation of the disclosed subject matter.

FIG. 3 shows an example laminate material according to an implementation of the disclosed subject matter. A second cut 350 may be made into the pieces 200 and 260 of the laminate material 100. The second cut 350 may be made by, for example, a UV-laser, including, for example, the same UV-laser used to make the first cut 250. The pieces 200 and 260 of the laminate material 100 may remain in place after the first cut 250 is made through the laminate material 100. The second cut 350 may be made at the location of the first cut 250, may be centered on the first cut 250, and may be made at the same angle as the first cut 250. The second cut 350 may be wider than the first cut 250. For example, the second cut 350 may have a width of one to twenty beam widths of the UV-laser. The second cut 350 may be made to any suitable depth into the first layer 210 and the first layer 270 of the pieces 200 and 260, and may stop before reaching the bottom electrodes 215 and 275. This may ensure that the second cut 350 does not cut into the conductive material of the second layers 220 and 280, preventing additional deposition of the conductive sediment 290 from the conductive material onto the first layers 210 and 270. The second cut 350 may remove portions of the first layers 210 and 270 onto which the conductive sediment 290 was deposited during the making of the first cut 250, as well parts of the top electrodes 205 and 265 that may have been in contact in with the conductive sediment 290. This may remove any electrical connection between the top electrode 205 and bottom electrode 215 or top electrode 265 and bottom electrode 275 that may have been created by deposition of conductive sediment 290 from the conductive material from the second layer 120 onto the sidewalls of the first layers 210 and 270 during the making of the first cut 250. The depth of the second cut 350 may be determined based on, for example, the breakdown voltage of the ambient environment in which the pieces 200 and 260 of the laminate material 100 will be used and the breakdown voltage of the non-conductive material of the first layer 110 of the laminate material 100. After completion of the second cut 350, the pieces 200 and 260 of the laminate material 100 may be subject to further processing.

Figure 4:
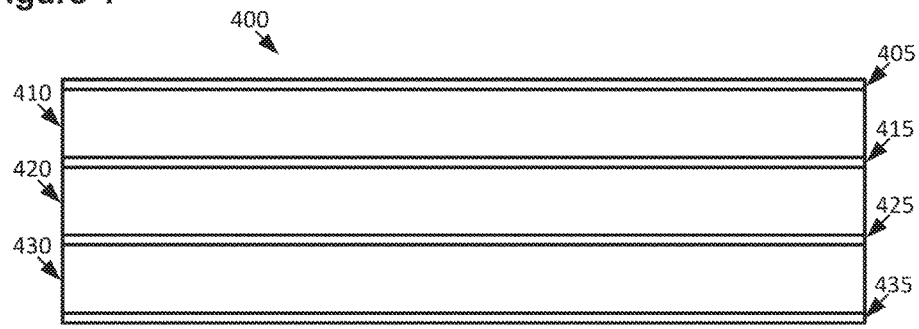
FIG. 4 shows an example laminate material according to an implementation of the disclosed subject matter.

FIG. 4 shows an example laminate material according to an implementation of the disclosed subject matter. A laminate material 400 may include a first layer 410, a second layer 420, and a third layer 430. The first layer 410 may be any suitable non-conductive material, including, for example, a piezoelectric material such as a piezoceramic or a dielectric material. The first layer 410 may include a top electrode 405 and a bottom electrode 415. The top electrode 405 and the bottom electrode 415 may be made of any suitable material, and may be attached or added to the non-conductive material of the first layer 410 in any suitable manner. The second layer 420 may be any suitable conductive material, including, for example, metals such as aluminum, stainless steel, and brass. The first layer 410 may electrically separate the top electrode 405 from the bottom electrode 415. The second layer 420 may be bonded to the first layer 410 at the bottom electrode 415 to form the laminate material 400. The bond may be made in any suitable manner, including, for example, through the use of conductive and non-conductive epoxies. The third layer 430 may be any suitable non-conductive material, including, for example, a piezoelectric material such as a piezoceramic or a dielectric material, and may be the same non-conductive material as the first layer 410. The third layer 430 may include a top electrode 435 and a bottom electrode 425. The top electrode 435 and the bottom electrode 425 may be made of any suitable material, and may be attached or added to the non-conductive material of the third layer 430 in any suitable manner. The third layer 430 may electrically separate the top electrode 435 from the bottom electrode 425. The second layer 420 may be bonded to the third layer 430 at the bottom electrode 425 to form the laminate material 400. The bond may be made in any suitable manner, including, for example, through the use of conductive and non-conductive epoxies.

Figure 5:
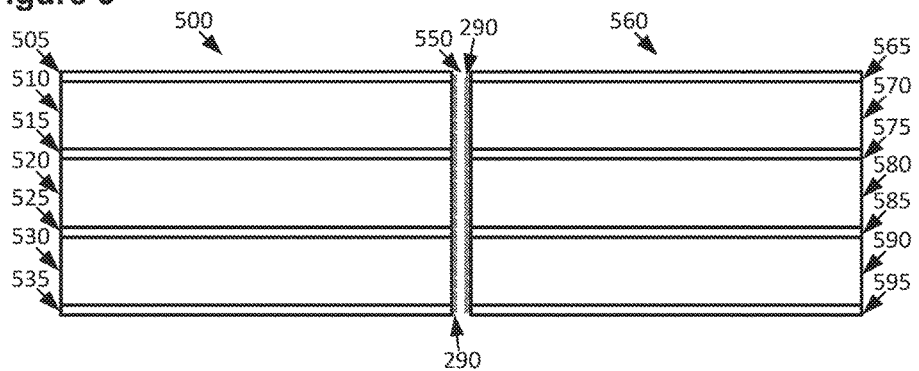
FIG. 5 shows an example laminate material according to an implementation of the disclosed subject matter.

FIG. 5 shows an example laminate material according to an implementation of the disclosed subject matter. A first cut 550 may be made through the laminate material 400. The first cut 250 may be made by, for example, a UV-laser, and may separate the laminate material 400 into a first piece 500 and second piece 560. The first piece 500 may include a first layer 510, a second layer 520, and a third layer 530. The first layer 510 may be a piece of the first layer 410 from the laminate material 400 and may include top electrode 505 and bottom electrode 515, which may be pieces of the top electrode 405 and the bottom electrode 415 from the laminate material 400. The second layer 520 may be a piece of the second layer 420 from the laminate material 400. The third layer 530 may be a piece of the third layer 430 from the laminate material 400, and may include top electrode 535 and bottom electrode 525, which may be pieces of the top electrode 435 and the bottom electrode 435 of the laminate material 400. The second piece 560 may include a first layer 570, a second layer 580, and a third layer 590. The first layer 570 may be a piece of the first layer 410 from the laminate material 400 and may include top electrode 565 and bottom electrode 575, which may be pieces of the top electrode 405 and the bottom electrode 415 from the laminate material 400. The second layer 580 may be a piece of the second layer 420 from the laminate material 400. The third layer 590 may be a piece of the third layer 430 from the laminate material 400, and may include top electrode 595 and bottom electrode 585, which may be pieces of the top electrode 435 and the bottom electrode 425 of the laminate material 400.

The first cut 550 may be any suitable width, and may be, for example, less than one beam width of the UV-laser used to make the cut. The first cut 550 may be straight, for example, creating edges with 90 degree corners, or may be made at any suitable angle through the laminate material 400. The first cut 550 may be made starting at the top electrode 405 and going through the third layer 430 and the top electrode 435, or may start at the top electrode 435 and go through the first layer 410 and the top electrode 405. During the making of the first cut 550, conductive material from the second layer 120 may be deposited as the conductive sediment 290 onto the sidewalls of the first layer 510, the first layer 570, the third layer 530 and the third layer 590 on either side of the first cut 550. For example, conductive material from the first layer 420 may melt or sublimate during the making of the first cut 550. The conductive sediment 290 may form an electrical connection between the top electrode 505 and bottom electrode 215 across the non-conductive first layer 510, between the top electrode 565 and the bottom electrode 575 across the non-conductive first layer 570, between the top electrode 535 and the bottom electrode 525 across the non-conductive third layer 530, and between the top electrode 595 and the bottom electrode 585 across the non-conductive third layer 590. These may be electrical shorts which may impact the performance of the pieces 500 and 560 of the laminate material 400.

Figure 6:
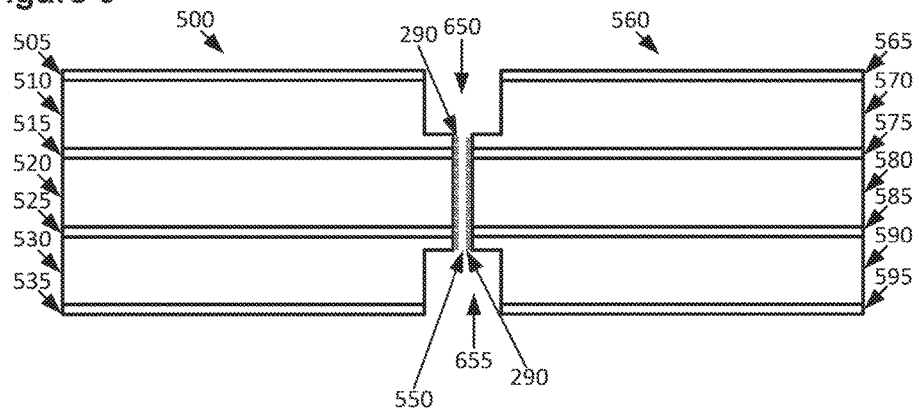
FIG. 6 shows an example laminate material according to an implementation of the disclosed subject matter.

FIG. 6 shows an example laminate material according to an implementation of the disclosed subject matter. A second cut 650 may be made into the pieces 500 and 560 of the laminate material 400. The second cut 650 may be made by, for example, a UV-laser, including, for example, the same UV-laser used to make the first cut 550. The pieces 500 and 560 of the laminate material 400 may remain in place after the first cut 550 is made through the laminate material 500. The second cut 650 may be made at the location of the first cut 550, may be centered on the first cut 550, and may be made at the same angle as the first cut 550. The second cut 650 may be wider than the first cut 550. For example, the second cut 650 may have a width of one to twenty beam widths of the UV-laser. The second cut 650 may be made to any suitable depth into the first layer 510 and the first layer 570 of the pieces 500 and 560, and may stop before reaching the bottom electrodes 515 and 575. This may ensure that the second cut 650 does not cut into the conductive material of the second layers 520 and 580, preventing additional deposition of the conductive sediment 290 from the conductive material onto the first layers 510 and 570. The second cut 650 may remove portions of the first layers 510 and 570 onto which the conductive sediment 290 was deposited during the making of the first cut 550, as well parts of the top electrodes 505 and 565 that may have been in contact in with the conductive sediment 290. This may remove any electrical connection between the top electrode 505 and bottom electrode 515 or top electrode 565 and bottom electrode 575 that may have been created by deposition of the conductive sediment 290 from the conductive material from the second layer 420 onto the sidewalls of the first layers 510 and 570 during the making of the first cut 550. The depth of the second cut 650 may be determined based on, for example, the breakdown voltage of the ambient environment in which the pieces 500 and 560 of the laminate material 400 will be used and the breakdown voltage of the non-conductive material of the first layer 410 of the laminate material 400.

A third cut 655 may be made into the pieces 500 and 560 of the laminate material 400. The third cut 655 may be made concurrently with the second cut 650, for example, using a separate UV-laser, or may be made after the second cut 650, for example, by the same UV-laser used to make the second cut 650. The pieces 500 and 560 of the laminate material 400 may remain in place after the first cut 550 is made through the laminate material 500. The third cut 655 may be made at the location of the first cut 550, may be centered on the first cut 550, and may be made at the same angle as the first cut 550. The third cut 655 may be wider than the first cut 550. For example, the third cut 655 may have a width of one to twenty beam widths of the UV-laser. The third cut 655 may be made to any suitable depth into the third layer 530 and the first layer 590 of the pieces 500 and 560, and may stop before reaching the bottom electrodes 525 and 585. This may ensure that the third cut 655 does not cut into the conductive material of the second layers 520 and 580, preventing additional deposition of the conductive sediment 290 from the conductive material onto the third layers 530 and 590. The third cut 655 may remove portions of the third layers 530 and 590 onto which the conductive sediment 2901 was deposited during the making of the first cut 550, as well parts of the top electrodes 535 and 595 that may have been in contact in with the conductive sediment 290. This may remove any electrical connection between the top electrode 535 and bottom electrode 525 or top electrode 595 and bottom electrode 585 that may have been created by deposition of the conductive sediment 290 from the conductive material from the second layer 420 onto the sidewalls of the third layers 530 and 590 during the making of the first cut 550. The depth of the third cut 655 may be determined based on, for example, the breakdown voltage of the ambient environment in which the pieces 500 and 560 of the laminate material 400 will be used and the breakdown voltage of the non-conductive material of the first layer 410 of the laminate material 400. After completion of the third cut 655, the pieces 500 and 560 of the laminate material 400 may be subject to further processing.

Figure 7:
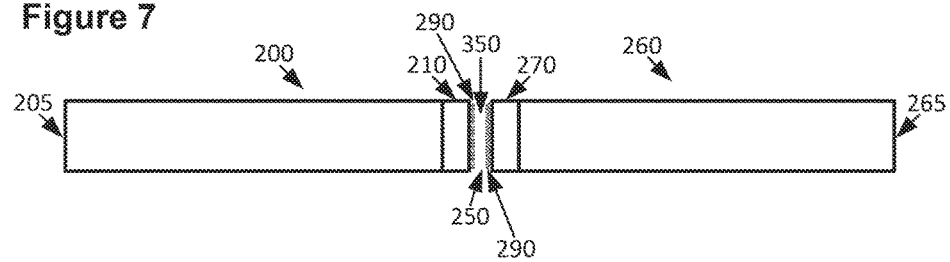
FIG. 7 shows an example laminate material according to an implementation of the disclosed subject matter.

FIG. 7 shows an example laminate material according to an implementation of the disclosed subject matter. When viewed from above, the pieces 200 and 260 of the laminate material 100 may include ridges created by the second cut 350. A small portion of the non-conductive material of the first layer 210 and the first layer 270 may be visible lower than the top electrodes 205 and 265 at the location of the second cut 250.

Figure 8:
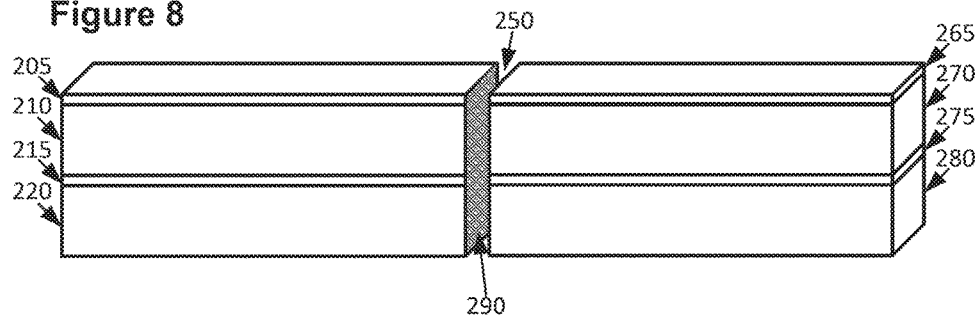
FIG. 8 shows an example laminate material according to an implementation of the disclosed subject matter.

FIG. 8 shows an example laminate material according to an implementation of the disclosed subject matter. The first cut 250 may separate the laminate material 100 into the pieces 200 and 260. The pieces 200 and 260 may include walls created at the location of the cut 250. The conductive sediment 290 from the conductive material from the second layer 120 may end up deposited on these walls or on the sidewalls of the first layer 210 and the first layer 270 during the making of the first cut 250 through melting or sublimation.

Figure 9:
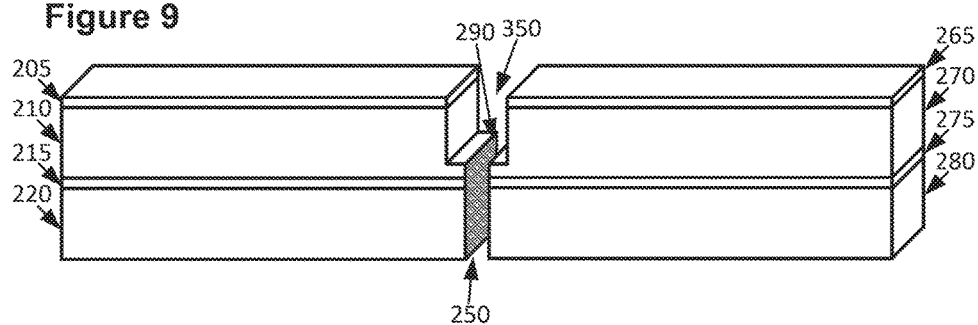
FIG. 9 shows an example laminate material according to an implementation of the disclosed subject matter.

FIG. 9 shows an example laminate material according to an implementation of the disclosed subject matter. The second cut 350 may remove parts of the top electrodes 205 and 265 and first layers 210 and 270 across the faces of the walls created by the first cut 250. This may result in the exposure of small ridges of the non-conductive material of the first layers 210 and 270 below the top electrodes 205 and 265. Any electrical connection between the top electrode 205 and the bottom electrode 215 or the top electrode 265 and the bottom electrode 275 created by conductive sediment 290 deposited on either the walls created by the first cut 250 or the existing sidewalls of the first layers 210 and 270 may be removed. The third cut 350 may remove the portions of the first layers 210 and 270 on which the conductive sediment 290 may have been deposited, and may also remove the portions of the top electrodes 205 and 265 that may have been in contact with any of the deposited conductive sediment 290.

Figure 10:
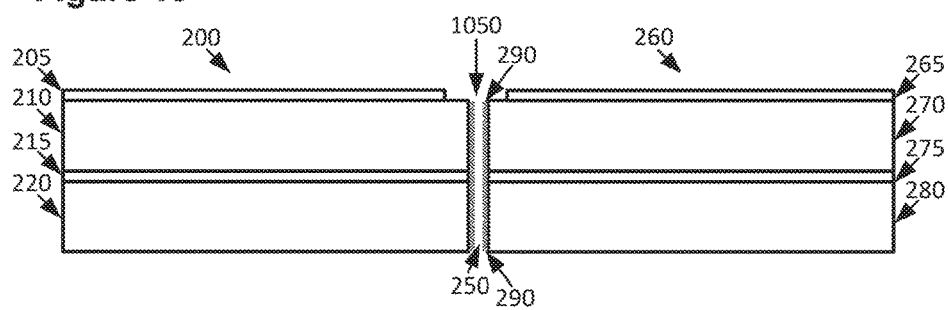
FIG. 10 shows an example laminate material according to an implementation of the disclosed subject matter.

FIG. 10 shows an example laminate material according to an implementation of the disclosed subject matter. After the laminate material 100 has been cut into the pieces 200 and 260, the top electrodes 205 and 265 may be ablated. For example, a UV-laser, such as the UV-laser used to make the first cut 250, may be used to ablate the top electrodes 205 and 265 with light, tightly packed passes. Ablation 1050 may be centered on the first cut 250, and may remove portions of the top electrodes 205 and 265 on either side of the first cut 250. Any suitable portion of the top electrodes 205 and 265 may be removed. For example, 100 micrometers may be ablated from each of the top electrodes 205 and 265, starting at the edges of the first cut 250. The ablation 1050 may remove portions of the top electrodes 205 and 265 that may have been in contact with conductive sediment 290 deposited on the sidewalls of the top layers 210 and 270 during the making of the first cut 250. This may remove an electrical connection the deposited conductive sediment 290 may have created between the top electrodes 205 and 265 and the bottom electrodes 215 and 275.

Figure 11:
FIG. 11 shows an example non-conductive material according to an implementation of the disclosed subject matter.

FIG. 11 shows an example non-conductive material according to an implementation of the disclosed subject matter. A non-conductive material 1100 may include a non-conductive layer 1110, a top electrode 1105, and a bottom electrode 1115. The non-conductive layer 1110 may be any suitable non-conductive material, including, for example, a piezoelectric material such as a piezoceramic. The top electrode 1105 and the bottom electrode 1115 may be made of any suitable material, and may be attached or added to the non-conductive layer 1110 in any suitable manner. The non-conductive layer 1110 may electrically separate the top electrode 1105 and the bottom electrode 1115.

Figure 12:
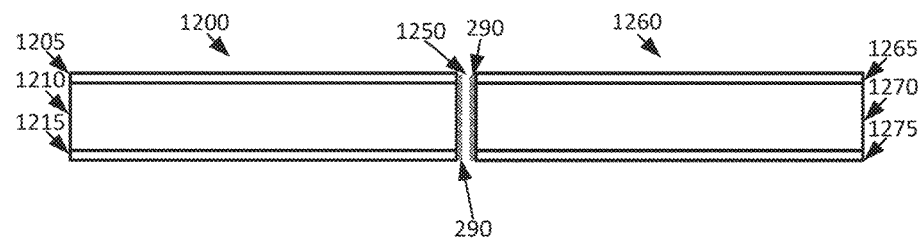
FIG. 12 shows an example non-conductive material according to an implementation of the disclosed subject matter.

FIG. 12 shows an example non-conductive material according to an implementation of the disclosed subject matter. A first cut 1250 may be made through the non-conductive material 1100. The first cut 1250 may be made by, for example, a UV-laser, and may separate the non-conductive material 1100 into a first piece 1200 and second piece 1260. The first piece 1200 may include a non-conductive layer 1210. The non-conductive layer 1210 may be a piece of the non-conductive layer 1110 from non-conductive material 1100 and may include top electrode 1205 and bottom electrode 1215, which may be pieces of the top electrode 1105 and the bottom electrode 1115 from the non-conductive material 1100. The second piece 1260 may include a non-conductive layer 1270. The non-conductive layer 1270 may be a piece of the non-conductive layer 1110 from the non-conductive material 1100 and may include top electrode 1265 and bottom electrode 1275, which may be pieces of the top electrode 1105 and the bottom electrode 1115 from the non-conductive material 1100.

The first cut 1250 may be any suitable width, and may be, for example, less than one beam width of the UV-laser used to make the cut. The first cut 1250 may be straight, for example, creating edges with 90 degree corners, or may be made at any suitable angle through the non-conductive material 1100. The first cut 1250 may be made starting at the top electrode 1105 and going through the bottom electrode 1115, or may start at the bottom electrode 1115 and go through the top electrode 1105. During the making of the first cut 1250, material from the top electrode 1105 or bottom electrode 1115 may enter into the first cut 1250, and may, for example, be deposited as the conductive sediment 290 onto the sidewalls of the non-conductive layer 1210 and the non-conductive layer 1270 on either side of the first cut 1250.

Figure 13:
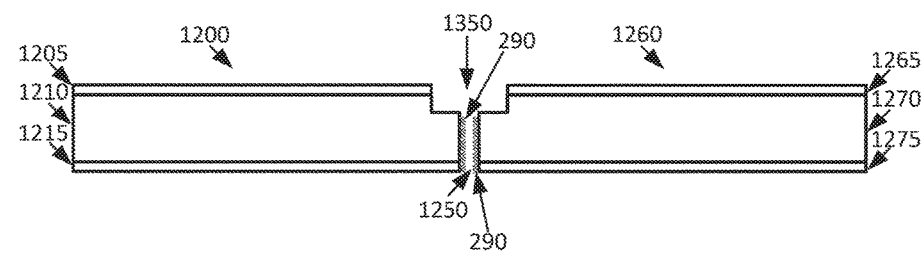
FIG. 13 shows an example non-conductive material according to an implementation of the disclosed subject matter.

FIG. 13 shows an example non-conductive material according to an implementation of the disclosed subject matter. A second cut 1350 may be made into the pieces 1200 and 1260 of the non-conductive material 1100. The second cut 350 may be made by, for example, a UV-laser, including, for example, the same UV-laser used to make the first cut 250. The pieces 1200 and 1260 of the non-conductive material 1100 may remain in place after the first cut 1250 is made through the non-conductive material 1100. The second cut 1350 may be made at the location of the first cut 1250, may be centered on the first cut 1250, and may be made at the same angle as the first cut 1250. The second cut 1350 may be wider than the first cut 1250. For example, the second cut 1350 may have a width of one to twenty beam widths of the UV-laser. The second cut 1350 may be made to any suitable depth into the non-conductive layer 1210 and the non-conductive layer 1270 of the pieces 1200 and 1260, and may stop before reaching the bottom electrodes 1215 and 1275. The second cut 1350 may remove portions of the non-conductive layers 1210 and 1270 onto which the conductive sediment 290 from the electrode material may have been deposited during the making of the first cut 1250, as well parts of the top electrodes 1205 and 1265 that may have been in contact in with the conductive sediment 290 from the electrode material. This may remove any electrical connection between the top electrode 1205 and bottom electrode 1215 or top electrode 1265 and bottom electrode 1275 that may have been created by the conductive sediment 290 from the electrode material entering the first cut 1250. The depth of the second cut 1350 may be determined based on, for example, the breakdown voltage of the ambient environment in which the pieces 1200 and 1260 of the non-conductive material 1100 will be used and the breakdown voltage of the non-conductive material of the non-conductive layer 1110 of the non-conductive material 1100. After completion of the second cut 1350, the pieces 1200 and 1260 of the non-conductive material 1100 may be subject to further processing.

Figure 14:
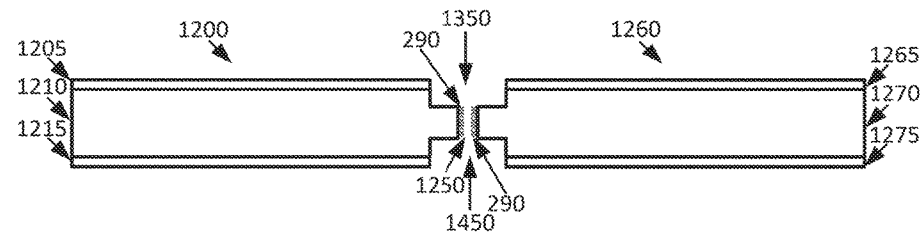
FIG. 14 shows an example non-conductive material according to an implementation of the disclosed subject matter.

FIG. 14 shows an example non-conductive material according to an implementation of the disclosed subject matter. A third cut 1450 may be made into the pieces 1200 and 1260 of the non-conductive material 1100. The third cut 1450 may be made concurrently with the second cut 1350, for example, using a separate UV-laser, or may be made after the second cut 650, for example, by the same UV-laser used to make the second cut 1350. The pieces 1200 and 1260 of the non-conductive material 1100 may remain in place after the first cut 1250 is made through the non-conductive material 1100. The third cut 1450 may be made at the location of the first cut 1250, may be centered on the first cut 1250, and may be made at the same angle as the first cut 1250. The third cut 1450 may be wider than the first cut 1250. For example, the third cut 1450 may have a width of one to twenty beam widths of the UV-laser. The third cut 1450 may be made to any suitable depth into the non-conductive layer 1210 and the non-conductive layer 1270 of the pieces 1260 and 1260, and may stop before reaching the top electrodes 1205 and 1265. The third cut 1450 may remove portions of the non-conductive layers 1210 and 1270 onto which the conductive sediment 290 from the electrode material may have been deposited during the making of the first cut 1250, as well parts of the bottom electrodes 1215 and 1275 that may have been in contact in with the conductive sediment 290 from the electrode material. This may remove any electrical connection between the top electrode 1205 and bottom electrode 1215 or top electrode 1265 and bottom electrode 1275 that may have been created by the conductive sediment 290 from the electrode material entering the first cut 1250. The depth of the third cut 1450 may be determined based on, for example, the breakdown voltage of the ambient environment in which the pieces 1260 and 1260 of the non-conductive material 1100 will be used and the breakdown voltage of the non-conductive material of the non-conductive layer 1110 of the non-conductive material 1100. After completion of the third cut 1450, the pieces 1260 and 1260 of the non-conductive material 1100 may be subject to further processing.

Figure 15:
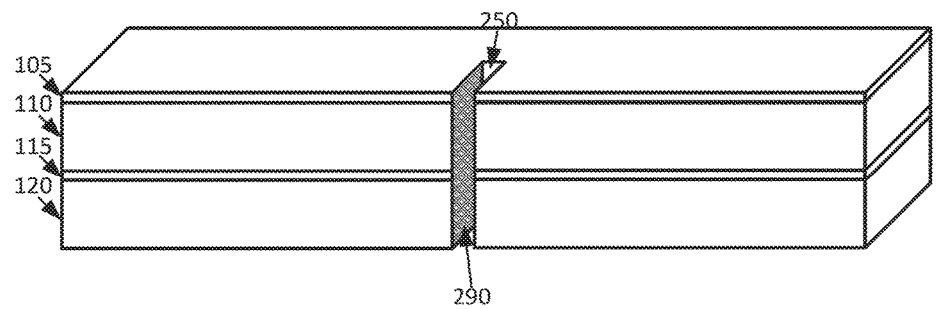
FIG. 15 shows an example laminate material according to an implementation of the disclosed subject matter.

FIG. 15 shows an example laminate material according to an implementation of the disclosed subject matter. In some implementations, the first cut 250 may not separate the laminate material 100 into the pieces 200 and 260. The laminate material 100 may remain as a single continuous piece. The first cut 250 may go through all of the layers of the laminate material 100, but may not divide the laminate material 100 into physically distinct, separable pieces. The first cut 250 may be in any suitable shape, and may be entirely contained within the laminate material 100, or may reach one edge of the laminate material 100. For example, the first cut 250 may be a U-shaped cut made into the laminate material 100. The laminate material 100 may include walls created at the location of the first cut 250. The conductive sediment 290 from the conductive material from the second layer 120 may end up deposited on these walls or on the sidewalls of the first layer 110 during the making of the first cut 250 through melting or sublimation.

Figure 16:
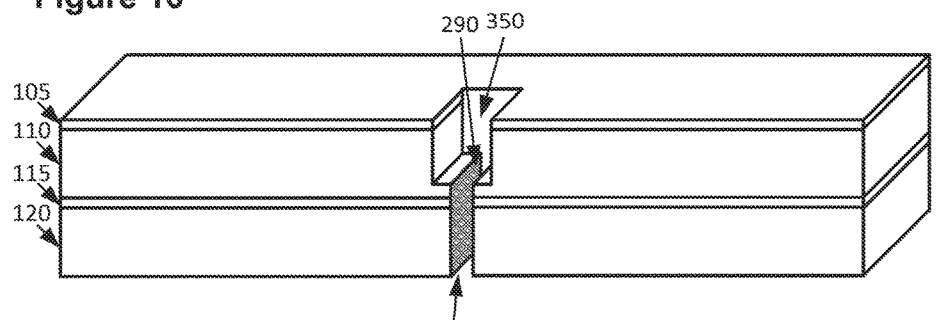
FIG. 16 shows an example laminate material according to an implementation of the disclosed subject matter.

FIG. 16 shows an example laminate material according to an implementation of the disclosed subject matter. The second cut 350 may remove parts of the top electrode 105 and first layer 110 across the faces of the walls created by the first cut 250. This may result in the exposure of small ridges of the non-conductive material of the first layer 110 below the top electrode 105. Any electrical connection between the top electrode 105 and the bottom electrode 115 created by conductive sediment 290 deposited on either the walls created by the first cut 250 or the existing sidewalls of the first layer 110 may be removed. The third cut 350 may remove the portions of the first layer 110 on which the conductive sediment 290 may have been deposited, and may also remove the portions of the top electrodes 105 that may have been in contact with any of the deposited conductive sediment 290.

Figure 17:
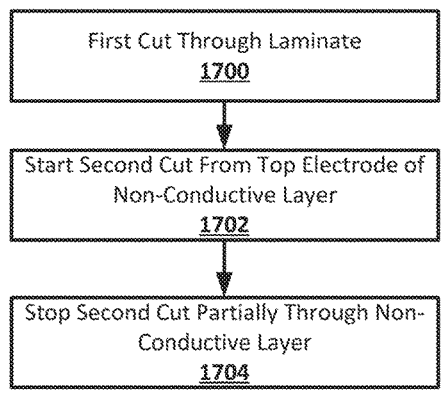
FIG. 17 shows a process suitable for trench cutting with laser machining according to an implementation of the disclosed subject matter.

FIG. 17 shows a process suitable for trench cutting with laser machining according to an implementation of the disclosed subject matter. At 1700, a first cut may be made through a laminate. For example, the first cut 250 may be made through the laminate material 100 with a UV-laser, separating the laminate material 100 into the pieces 200 and 260. The first cut 250 may also be made through the laminate material 100 without separating the laminate material into the pieces 200 and 260.

At 1702, a second cut may be started at a top electrode of a non-conductive layer. For example, the second cut 350 may made into the pieces 200 and 260 of the laminate material 100 at the location of the first cut 250 using the UV-laser. The second cut 350 may be wider than the first cut 250, and may be started at the top electrodes 205 and 265 of the non-conductive first layers 210 and 270 of the pieces 200 and 260. If the laminate material 100 was not separated into pieces by the first cut 205, the second cut 350 may start at the top electrode 105 of the non-conductive first layer 110.

At 1704, the second cut may be stopped partially through the non-conductive layer. For example, the UV-laser may stop making the second cut 350 while the second cut 350 is partially though the non-conductive first layers 210 and 270, or the non-conductive first layer 110. The second cut 350 may remove parts of the top electrodes 205 and 265, or the top electrode 105, and the non-conductive first layers 210 and 270, or the non-conductive first layer 110, and may remove some of the conductive sediment 290 deposited on the non-conductive first layers 210 and 270, or the non-conductive first layer 110, during the making of the first cut 250.

Figure 18:
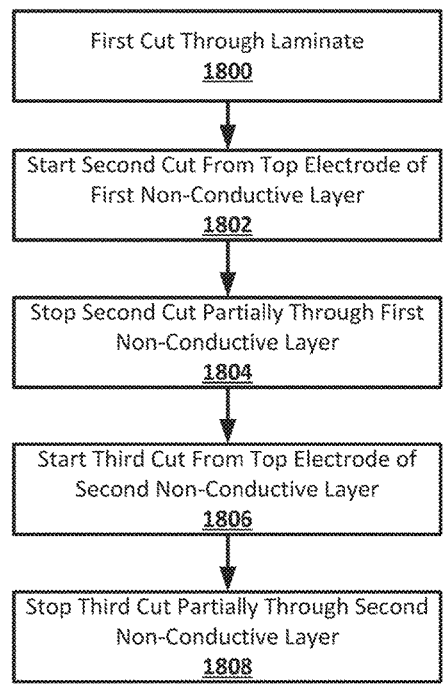
FIG. 18 shows a process suitable for trench cutting with laser machining according to an implementation of the disclosed subject matter.

FIG. 18 shows a process suitable for trench cutting with laser machining according to an implementation of the disclosed subject matter. At 1800, a first cut may be made through a laminate. For example, the first cut 550 may be made through the laminate material 400 with a UV-laser, separating the laminate material 400 into the pieces 500 and 560. The first cut 250 may also be made through the laminate material 400 without separating the laminate material into the pieces 500 and 600.

At 1802, a second cut may be started at a top electrode of a first non-conductive layer. For example, the second cut 650 may made into the pieces 500 and 560 of the laminate material 400 at the location of the first cut 550 using the UV-laser. The second cut 650 may be wider than the first cut 550, and may be started at the top electrodes 505 and 565 of the non-conductive first layers 510 and 570 of the pieces 500 and 560. If the laminate material 400 was not separated into pieces by the first cut 550, the second cut 650 may start at the top electrode 405 of the non-conductive first layer 410.

At 1804, the second cut may be stopped partially through the first non-conductive layer. For example, the UV-laser may stop making the second cut 650 while the second cut 650 is partially though the non-conductive first layers 510 and 570, or the non-conductive first layer 410. The second cut 650 may remove parts of the top electrodes 505 and 565, or the top electrode 405, and the non-conductive first layers 510 and 570, or the non-conductive first layer 410, and may remove some of the conductive sediment 290 deposited on the non-conductive first layers 510 and 570, or the non-conductive first layer 410 during the making of the first cut 550.

At 1806, a third cut may be started at a top electrode of a second non-conductive layer. For example, the third cut 655 may made into the pieces 500 and 560 of the laminate material 400 at the location of the first cut 550 using the UV-laser. The third cut 655 may be wider than the first cut 550, for example, the same width as the second cut 650, and may be started at the top electrodes 535 and 595 of the non-conductive third layers 530 and 590 of the pieces 500 and 560. If the laminate material 400 was not separated into pieces by the first cut 550, the third cut 655 may start at the top electrode 435 of the non-conductive first layer 410.

At 1808, the third cut may be stopped partially through the second non-conductive layer. For example, the UV-laser may stop making the third cut 655 while the third cut 655 is partially though the non-conductive third layers 530 and 590, or the non-conductive third layer 430. The third cut 655 may remove parts of the top electrodes 535 and 595, or the top electrode 435, and the non-conductive third layers 530 and 590, or the non-conductive third layer 430, and may remove some of the conductive sediment 290 deposited on the non-conductive third layers 530 and 590, or the non-conductive third layer 430, during the making of the first cut 550.

Figure 19:
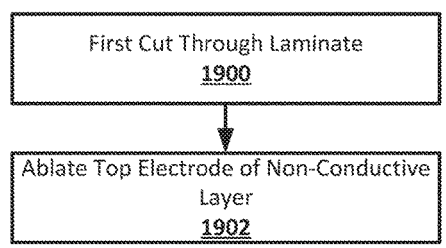
FIG. 19 shows a process suitable for trench cutting with laser machining according to an implementation of the disclosed subject matter.

FIG. 19 shows a process suitable for trench cutting with laser machining according to an implementation of the disclosed subject matter. At 1900, a first cut may be made through a laminate. For example, the first cut 250 may be made through the laminate material 100 with a UV-laser, separating the laminate material 100 into the pieces 200 and 260. The first cut 250 may also be made through the laminate material 100 without separating the laminate material into the pieces 200 and 260.

At 1902, a top electrode of a non-conductive layer may be ablated. For example, the UV-laser may be used to ablate the top electrodes 205 and 265 of the pieces 200 and 600, or the top electrode 105 of the laminate 100, on either side of the first cut 250. The UV-laser may be used to ablate any suitable amount of the top electrodes 205 and 265 or the top electrode 105, such as, for example, 100 micrometers of the top electrodes 205 and 265 starting from the edge created by the cut 250, or 100 micrometers of the top electrode 105 on either side of the cut 250. The ablation may remove parts of the top electrodes 205 and 265, or the top electrode 105, that may have been in contact with the conductive sediment 290 deposited on the non-conductive first layers 210 and 270, or the non-conducive first layer 110, during the making of the first cut 250.

Figure 20:
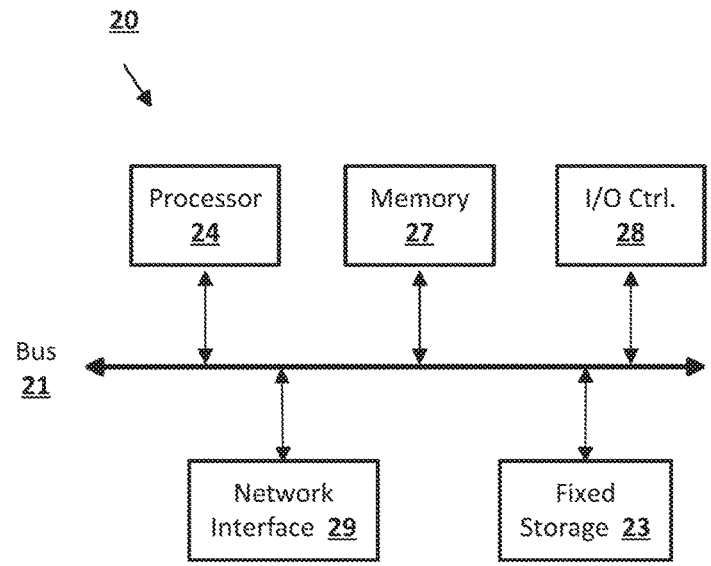
FIG. 20 shows a computer according to an embodiment of the disclosed subject matter.

Embodiments of the presently disclosed subject matter may be implemented in and used with a variety of component and network architectures. FIG. 20 is an example computer system 20 suitable for implementing embodiments of the presently disclosed subject matter. The computer 20 includes a bus 21 which interconnects major components of the computer 20, such as one or more processors 24, memory 27 such as RAM, ROM, flash RAM, or the like, an input/output controller 28, and fixed storage 23 such as a hard drive, flash storage, SAN device, or the like. It will be understood that other components may or may not be included, such as a user display such as a display screen via a display adapter, user input interfaces such as controllers and associated user input devices such as a keyboard, mouse, touchscreen, or the like, and other components known in the art to use in or in conjunction with general-purpose computing systems.

The bus 21 allows data communication between the central processor 24 and the memory 27. The RAM is generally the main memory into which the operating system and application programs are loaded. The ROM or flash memory can contain, among other code, the Basic Input-Output system (BIOS) which controls basic hardware operation such as the interaction with peripheral components. Applications resident with the computer 20 are generally stored on and accessed via a computer readable medium, such as the fixed storage 23 and/or the memory 27, an optical drive, external storage mechanism, or the like.

Each component shown may be integral with the computer 20 or may be separate and accessed through other interfaces. Other interfaces, such as a network interface 29, may provide a connection to remote systems and devices via a telephone link, wired or wireless local- or wide-area network connection, proprietary network connections, or the like. For example, the network interface 29 may allow the computer to communicate with other computers via one or more local, wide-area, or other networks, as shown in FIG. 21.

Many other devices or components (not shown) may be connected in a similar manner, such as document scanners, digital cameras, auxiliary, supplemental, or backup systems, or the like. Conversely, all of the components shown in FIG. 20 need not be present to practice the present disclosure. The components can be interconnected in different ways from that shown. The operation of a computer such as that shown in FIG. 20 is readily known in the art and is not discussed in detail in this application. Code to implement the present disclosure can be stored in computer-readable storage media such as one or more of the memory 27, fixed storage 23, remote storage locations, or any other storage mechanism known in the art.

Figure 21:
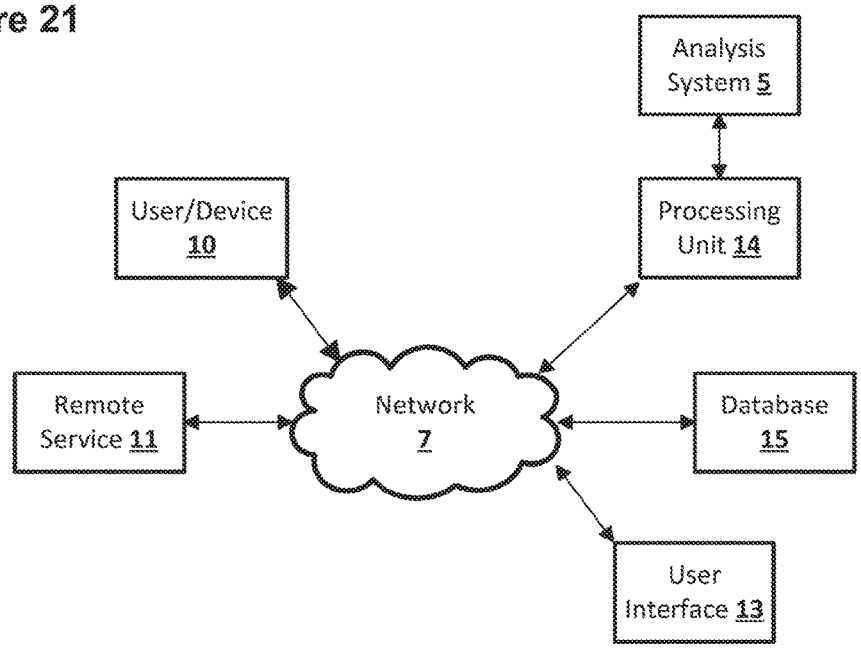
FIG. 21 shows a network configuration according to an embodiment of the disclosed subject matter.

FIG. 21 shows an example arrangement according to an embodiment of the disclosed subject matter. One or more clients 10, 11, such as local computers, smart phones, tablet computing devices, remote services, and the like may connect to other devices via one or more networks 7. The network may be a local network, wide-area network, the Internet, or any other suitable communication network or networks, and may be implemented on any suitable platform including wired and/or wireless networks. The clients 10, 11 may communicate with one or more computer systems, such as processing units 14, databases 15, and user interface systems 13. In some cases, clients 10, 11 may communicate with a user interface system 13, which may provide access to one or more other systems such as a database 15, a processing unit 14, or the like. For example, the user interface 13 may be a user-accessible web page that provides data from one or more other computer systems. The user interface 13 may provide different interfaces to different clients, such as where a human-readable web page is provided to web browser clients 10, and a computer-readable API or other interface is provided to remote service clients 11. The user interface 13, database 15, and processing units 14 may be part of an integral system, or may include multiple computer systems communicating via a private network, the Internet, or any other suitable network. Processing units 14 may be, for example, part of a distributed system such as a cloud-based computing system, search engine, content delivery system, or the like, which may also include or communicate with a database 15 and/or user interface 13. In some arrangements, an analysis system 5 may provide back-end processing, such as where stored or acquired data is pre-processed by the analysis system 5 before delivery to the processing unit 14, database 15, and/or user interface 13. For example, a machine learning system 5 may provide various prediction models, data analysis, or the like to one or more other systems 13, 14, 15.

The foregoing description, for purpose of explanation, has been described with reference to specific embodiments. However, the illustrative discussions above are not intended to be exhaustive or to limit embodiments of the disclosed subject matter to the precise forms disclosed. Many modifications and variations are possible in view of the above teachings. The embodiments were chosen and described in order to explain the principles of embodiments of the disclosed subject matter and their practical applications, to thereby enable others skilled in the art to utilize those embodiments as well as various embodiments with various modifications as may be suited to the particular use contemplated.

The invention claimed is:

1. A method comprising:
cutting, using a UV-laser, a laminate material comprising a conductive layer and a non-conductive layer with a first cut;
starting the cutting of a second cut, using a UV-laser, at a top electrode of the non-conductive layer based on the location of the first cut, wherein the second cut is wider than the first cut; and
stopping the cutting of the second cut partially though the non-conductive layer.

2. The method of claim 1, wherein cutting, using a UV-laser, uses a first UV-laser, and starting a second cut, using a UV-laser, uses a second UV-laser.

3. The method of claim 1, wherein cutting, using a UV-laser, uses a first UV-laser, and starting a second cut, using a UV-laser, uses the first UV-laser.

4. The method of claim 1, wherein the non-conductive layer comprises a piezoelectric material.

5. The method of claim 1, wherein stopping the cutting of the second cut partially though the non-conductive layer further comprises stopping the cutting of the second cut before cutting a bottom electrode of the non-conductive layer.

6. The method of claim 1, wherein the stopping of the cutting of the second cut is based on one or more of the breakdown voltage of the ambient environment in which the laminate material will be used and the breakdown voltage of a non-conductive material of the non-conductive layer of the laminate material.

7. The method of claim 1, wherein the laminate material further comprises a second non-conductive layer.

8. The method of claim 7, further comprising:
starting the cutting of a third cut, using a UV-laser, at a top electrode of the second non-conductive layer based on the location of the first cut, wherein the third cut is wider than the first cut; and
stopping the cutting of the third cut partially though the second non-conductive layer.

9. The method of claim 8, wherein the third cut is the same width as the second cut.

10. The method of claim 8, wherein the third cut is cut to a depth into the second non-conductive layer that is the same as the depth the second cut is cut into the non-conductive layer.

11. The method of claim of claim 1, wherein the second cut has a width between one and twenty beam widths of the UV-laser used to cut the second cut.

12. A method comprising:
cutting, using a UV-laser, a laminate material comprising a conductive layer and a non-conductive layer with a first cut; and
ablating, using a UV-laser, the top electrode the non-conductive layer based on the location of the first cut, wherein the ablation removes portions of the top electrode starting at the edges of the first cut.

13. The method of claim 12, wherein cutting, using a UV-laser, uses a first UV-laser, and ablating, with a UV-laser, uses a second UV-laser.

14. The method of claim 12, wherein cutting, using a UV-laser, uses a first UV-laser, and ablating, with a UV-laser, uses the first UV-laser.

15. The method of claim 12, wherein the UV-laser ablates a length of at least 100 micrometers of the top electrode starting at one of the edges of the first cut.

16. The method of claim 12, wherein the laminate material further comprises a second non-conductive layer.

17. The method of claim 7, further comprising:
ablating, using a UV-laser, the top electrode of the second non-conductive layer based on the location of the first cut, wherein the ablation removes portions of the top electrode starting at the edges of the first cut.

18. A method comprising:
cutting, using a UV-laser, a non-conductive material with a first cut;
starting the cutting of a second cut, using a UV-laser, at a top electrode of the non-conductive material based on the location of the first cut, wherein the second cut is wider than the first cut; and
stopping the cutting of the second cut partially though the non-conductive material.

19. The method of claim 18, further comprising:
starting the cutting of a third cut, using a UV-laser, at a bottom electrode of the non-conductive material based on the location of the first cut, wherein the third cut is wider than the first cut; and
stopping the cutting of the third cut partially though the non-conductive material.

20. The method of claim 19, wherein the third cut is the same width as the second cut.

* * * * *